(12) United States Patent
Bersted et al.

(10) Patent No.: US 7,709,568 B2
(45) Date of Patent: May 4, 2010

US007709568B2

(54) ANTI-YELLOWING POLYCONDENSATION POLYMER COMPOSITIONS AND ARTICLES

(75) Inventors: Bruce H. Bersted, Cumming, GA (US); Ernest Seet, The Ansley (SG); Eric Hsiao, Taipei (TW); Henri Massillon, Waremme (BE)

(73) Assignee: Solvay Advanced Polymers, LLC, Alpharetta, GA (US)

( * ) Notice: Subject to any disclaimer, the term of this patent is extended or adjusted under 35 U.S.C. 154(b) by 920 days.

(21) Appl. No.: 10/531,251

(22) PCT Filed: Oct. 15, 2003

(86) PCT No.: PCT/US03/32603

§ 371 (c)(1),
(2), (4) Date: Oct. 7, 2005

(87) PCT Pub. No.: WO2004/036661

PCT Pub. Date: Apr. 29, 2004

(65) Prior Publication Data

US 2006/0148962 A1    Jul. 6, 2006

Related U.S. Application Data

(60) Provisional application No. 60/418,184, filed on Oct. 15, 2002.

(51) Int. Cl.
*C08L 77/00* (2006.01)
*C08L 71/00* (2006.01)
*C08L 79/00* (2006.01)
*C08L 81/00* (2006.01)
*C08K 3/00* (2006.01)
*H01L 33/00* (2006.01)

(52) U.S. Cl. .................. 524/413; 428/31; 524/420; 524/423; 524/430; 524/495; 524/497; 524/500; 524/538; 524/539; 524/540

(58) Field of Classification Search ............... 524/413, 524/420, 423, 430, 495, 497, 500, 538, 539, 524/540; 428/31
See application file for complete search history.

(56) References Cited

U.S. PATENT DOCUMENTS

| 4,108,837 | A |   | 8/1978 | Johnson et al. |         |
|-----------|---|---|--------|----------------|---------|
| 4,175,175 | A |   | 11/1979| Johnson et al. |         |
| 4,976,890 | A |   | 12/1990| Felter et al.  |         |
| RE34,447  | E |   | 11/1993| Poppe et al.   |         |
| 5,391,640 | A | * | 2/1995 | Akkapeddi et al.| 525/432 |
| 5,436,294 | A |   | 7/1995 | Desio et al.   |         |
| 5,447,980 | A |   | 9/1995 | Reichmann      |         |
| 5,534,584 | A |   | 7/1996 | Kitamura et al.|         |
| 5,662,857 | A |   | 9/1997 | Fu             |         |
| 5,760,125 | A | * | 6/1998 | Ohtomo et al.  | 524/508 |
| 6,249,271 | B1|   | 6/2001 | Albert et al.  |         |
| 6,355,723 | B1|   | 3/2002 | Van Baal et al.|         |
| 2002/0187328 | A1|   | 12/2002 | Murschall et al. |     |

FOREIGN PATENT DOCUMENTS

| CA | 847 963     | 7/1970  |
|----|-------------|---------|
| EP | 0 356 100   | 2/1990  |
| EP | 0 926 175   | 6/1999  |
| JP | 09-081055   | 3/1997  |
| WO | WO 99/61245 | 12/1999 |
| WO | 00/20510    | 4/2000  |
| WO | 00/60009    | 10/2000 |
| WO | WO 01/77215 | 10/2001 |

\* cited by examiner

*Primary Examiner*—Ana L Woodward
(74) *Attorney, Agent, or Firm*—Oblon, Spivak, McClelland, Maier & Neustadt, L.L.P.

(57) ABSTRACT

A composition, having an improved resistance to yellowing under heat aging, comprising at least 20 weight % of at least one polycondensation polymer having a heat deflection temperature of above 80° C. under a load of 1.82 MPa when measured according to ASTM D648, from 0 to 5 weight % of at least one polymer having a heat deflection temperature of at most 80° C. under a load of 1.82 MPa when measured according to ASTM D648, a white pigment; and a black pigment provides resistance to heat aging induced yellowing. The polycondensation polymers are advantageously selected from the group consisting of polyarylethersulfones, at least partially aromatic polyamides, polyamideimides, liquid crystalline polymers, polyimides, polyetherimides, polyaryletherketones, and polyphenylene sulfides. The polymer composition can be molded to form a variety of articles, including LED components, such as reflectors, reflector cups, and scramblers.

42 Claims, 4 Drawing Sheets

ANTI-YELLOWING POLYCONDENSATION POLYMER COMPOSITIONS AND ARTICLES

CROSS REFERENCE TO PROVISIONAL APPLICATIONS

This application claims priority from U.S. provisional patent application Ser. No. 60/418,184; filed Oct. 15, 2002, the entire disclosure of which is incorporated herein by reference.

TECHNICAL FIELD

This invention is directed to polycondensation polymer compositions having an improved resistance to yellowing under heat aging, and articles formed from the polymer compositions, including reflectors, reflector cups, and scramblers for light emitting diodes.

BACKGROUND OF THE INVENTION

Light emitting diode (LED) components, such as reflectors, reflector cups, and scramblers are typically formed from polymer compositions. LED applications require polymer compositions with good opacity and reflective properties. Various useful polymer compositions for LED applications are known, these ones usually include polycondensation polymers, such as polyphthalamides. One problem noted with the prior art compositions used in LED applications is yellowing upon heat aging.

LED components are exposed to elevated temperatures during the manufacturing process. For example, during the fabricating steps the LED components are heated to about 180° C. to cure an epoxy potting compound. The LED components are also exposed to temperatures above 260° C. while soldering operations are performed. In addition, while in use, LED components, such as automobile components, are routinely subjected to temperatures above 80° C. This exposure to high temperatures causes yellowing of polymer compositions used for forming LED components.

Another polymer composition used for LED components comprises polycarbonate. Polycarbonate compositions, however, soften when exposed to the epoxy curing and soldering temperatures. LED components formed from polycarbonate compositions would not retain their shape at these temperatures.

Yellowing is a particularly acute problem for blue light LEDs. Yellow surfaces absorb blue light. Thus, yellow reflectors absorb blue light rather and are, therefore, inefficient reflectors.

SUMMARY OF THE INVENTION

There exists a need in the reflector art for polycondensation polymer compositions capable of withstanding long-term exposure to high temperatures. There exists a need in the reflector art for polycondensation polymer compositions that do not yellow upon heat aging. There exists a need in the reflector art for reflectors, reflector cups, and scramblers formed from polycondensation polymer compositions that resist yellowing upon heat aging while maintaining excellent opacity and reflective properties.

These and other needs are met by certain embodiments of the present invention that provide a polymer composition comprising at least 20 weight % of at least one polycondensation polymer having a heat deflection temperature of above 80° C. under a load of 1.82 MPa when measured according to ASTM D648. The composition further comprises from 0 to 5 weight % of at least one polymer having a heat deflection temperature of at most 80° C. under a load of 1.82 MPa when measured according to ASTM D648. In addition, the polymer composition comprises a white pigment and a black pigment.

In certain embodiments of the present invention, the polycondensation polymer is selected from the group consisting of polyarylethersulfones, at least partially aromatic polyamides, polyamideimides, liquid crystalline polymers, polyimides, polyetherimides, polyaryletherketones, and polyphenylene sulfides.

These and other needs are further met by certain embodiments of the present invention that provide a shaped article formed from the polymer composition as above detailed.

These and other needs are additionally met by certain embodiments of the present invention wherein the shaped articles are a reflector for an LCD, reflector cup for a surface mount LED, or a scrambler for a seven-segment light LED.

In addition, these and other needs are met by a method of forming a shaped article comprising providing a polymer composition as above detailed.

Furthermore, these and other needs are met by using a black pigment to improve the heat-stability of a white-pigmented polycondensation polymer composition.

In certain embodiments of the present invention, the black pigment is a carbon black, the white pigment is titanium dioxide, and the polycondensation polymer is a polyphthalamide.

The present invention provides a new polymer composition that inhibits yellowing of high-temperature polycondensation polymers upon heat aging. The present invention provides reflectors, reflector cups, and scramblers with excellent opacity and reflective properties.

The present invention also provides a cost effective polycondensation polymer composition for use in reflectors, reflector cups, and scramblers. The present invention addresses the longstanding limitation of yellowing of polycondensation polymers upon heat aging.

Additional advantages and aspects of the present invention will become readily apparent to those skilled in the art from the following detailed description, wherein embodiments of the present invention are shown and described, by way of illustration of the best mode contemplated for practicing the present invention. As will be described, the present invention is capable of other and different embodiments, and its several details are susceptible to modification in various obvious respects, all without departing from the spirit of the present invention. Accordingly, the description is to be regarded as illustrative in nature, and not as limitative.

DETAILED DESCRIPTION OF THE INVENTION

In many applications polymers that are capable of withstanding elevated temperatures, and that have good strength, and tolerance to a host of chemical environments are required.

Polymers that are suitable for use in the present invention are polycondensation engineering polymers. Polycondensation polymers are polymers that are formed from a repeating condensation reaction. Engineering polymers are thermoplastics that advantageously maintain dimensional stability and most mechanical properties above 80° C. and below 0° C. Engineering polymers can be advantageously formed into functional parts that can bear loads and withstand abuse in temperature environments commonly experienced by traditional engineering materials, such as wood, metals, glass, and ceramics.

Aromatic polycondensation polymers, in particular, provide high temperature service, high strength, and chemical resistance. Aromatic polycondensation polymers are polymers formed by the condensation reaction of two compounds, wherein at least one of the compounds comprises at least one aromatic group. Aromatic polycondensation polymers are well suited for forming LED components.

Polycondensation polymers that are suitable for certain embodiments of the present invention are high temperature polycondensation polymers. High temperature polycondensation polymers are defined as polycondensation polymers that have a heat deflection temperature (HDT) of above 80° C. under a load of 1.82 MPa when measured according to ASTM D648. Typical heat deflection temperatures of certain polycondensation polymers are listed in Table 1.

TABLE 1

High Temperature Polycondensation Polymers

| Polycondensation Polymer | Heat Deflection Temp. (° C.) |
| --- | --- |
| Polysulfone | 174 |
| Polyethersulfone | 203 |
| Polyphenylsulfone | 204 |
| Polyphthalamide | 120 |
| Polyamideimide | 278 |
| Liquid crystalline polymers (LCP) (there are several different conventional LCPs) | 180–310 |
| Polyimide | 360 |
| Polyetherimide | 200 |
| Polyetheretherketone (low flow) | 160 |
| Polyetheretherketone (high flow) | 171 |
| Polyphenylene sulfide | 135 |
| Polycarbonate | 132 |

Heat deflection temperatures of polymers and polymer compositions are determined according to ASTM D648, Method A, using a span of 4 inches. The polymer is injection molded into plaques that are 5 inches long, ½ inch wide, and ⅛ inch thick. The plaques are immersed in a suitable liquid heat-transfer medium, such as an oil, during the HDT test. Dow Corning 710 silicone oil, for example, is used for polyphthalamide polymers and compositions. For polycondensation polymers and compositions, such as polyphthalamides and polyphthalamide compositions, the HDT test is performed on unannealed specimens.

In the present invention, the addition of a black pigment to a polycondensation polymer composition unexpectedly provides resistance to heat aging induced yellowing of articles formed from the composition, such as LED components. Polymer compositions according to the present invention comprise a polycondensation polymer, a white pigment, and a black pigment.

In certain embodiments of the present invention, the polycondensation polymer is present in the polymer composition in a concentration of at least about 55 weight %. In certain other embodiments of the present invention, the polycondensation polymer is present in the polymer composition in a concentration of at least about 43 weight %. In certain other embodiments of the present invention, the polycondensation polymer is present in the polymer composition in a concentration of at least about 40 weight %. In certain embodiments of the present invention, the polycondensation polymer is present in the polymer composition in a concentration of up to about 90 weight %. In certain other embodiments of the present invention, the polycondensation polymer is present in the polymer composition in a concentration of up to about 75 weight %. The concentration of polymer in the polymer composition is based on the total weight of the polymer composition.

Suitable polycondensation engineering polymers for use in certain embodiments of the present invention include polyarylethersulfones, at least partially aromatic polyamides, polyamideimides, liquid crystalline polymers, polyimides, polyetherimides, polyaryletherketones, and polyphenylene sulfides.

In certain embodiments of the present invention, suitable at least partially aromatic polyamides are polyphthalamides. Suitable polyphthalamides for certain embodiments of the present invention are formed by a polycondensation reaction between at least one aromatic dicarboxylic acid and a diamine. In certain embodiments, the aromatic dicarboxylic acid is terephthalic acid. In certain other embodiments of the present invention, the polyphthalamide further comprises isophthalic acid residues. In other certain embodiments of the present invention, the polyphthalamide is further formed from an aliphatic dicarboxylic acid, such as adipic acid. In certain other embodiments of the present invention, the diamine is an aliphatic diamine. Suitable aliphatic diamines for certain embodiments of the present invention comprise 4 to 12 carbon atoms, such as hexamethylene diamine (HMDA), nonane diamine, 2-methyl-1,5 pentadiamine, and 1,4-diaminobutane. Suitable polyphthalamides for certain embodiments of the present invention are disclosed in U.S. Pat. Nos. 5,436,294; 5,447,980; and Re34,447; the entire disclosures of which are incorporated herein by reference. In certain embodiments of the present invention, the molar amount of dicarboxylic acid used in the polyphthalamide is from about 50% to about 75% terephthalic acid, from about 0% to about 45% adipic acid, and from about 0% to about 35% isophthalic acid.

In certain embodiments of the instant invention, the dicarboxylic acid component of the polyphthalamide comprises from about 55 mole % to about 75 mole % terephthalic acid and from 25 mole % adipic acid to about 45 mole %, and the diamine component comprises about 100 mole % hexamethylene diamine. In a certain embodiment of the instant invention, the dicarboxylic acid component of the polyphthalamide comprises about 65 mole % terephthalic acid and 35 mole % adipic acid, and the diamine component comprises about 100% hexamethylene diamine.

In certain embodiments of the present invention, the dicarboxylic acid used in forming the polyphthalamide comprises a mole ratio of aromatic dicarboxylic acid groups in the range from at least about 50 mole % aromatic groups to about 100% aromatic groups. In certain embodiments of the present invention, the polyphthalamide polymer comprises from about 50 mole % to about 95 mole % hexamethylene terephthalamide units, from about 25 mole % to about 0 mole % hexamethylene isophthalamide units, and from about 50 mole % to about 5 mole % hexamethylene adipamide units. Suitable polyphthalamides for use in the present invention are available as AMODEL® polyphthalamides from Solvay Advanced Polymers, L.L.C.

Other at least partially aromatic polyamides suitable for use in the present invention include polyamides formed from the reaction of an aliphatic dicarboxylic with an aromatic diamine. Suitable partially aromatic polyamides formed from aromatic diamine include the reaction product of adipic acid and m-xylene diamine. Such partially aromatic polyamides are available as IXEF® polyarylamide from Solvay Advanced Polymer, L.L.C.

Partially aromatic polyamides suitable for use in the polymer compositions according to the present invention include polyamides formed from dicarboxylic acids and diamines, wherein up to 100 mole % of the dicarboxylic acids are aromatic dicarboxylic acids and up to 100 mole % of the diamines are aromatic diamines.

Other aromatic polycondensation polymers suitable for use in the polymer compositions according to the present invention include polyarylethersulfones. The polyarylethersulfone polymers used in this invention are defined as polyarylene compounds in which arylene units exist irregularly or regularly together with ether and sulfone linkages. Examples of sulfone polymers within the scope of the present invention polymers comprise the following structural formulae (1) to (16) where n is an integer of at least 10. Generally, the average number of repeat units n is greater than 30 and more typically greater than about 40 to ensure sufficiently high molecular weight for robust physical and mechanical integrity of the polymers when fabricated into structural components.

polyetherethersulfone, and blends and copolymers thereof. The structural repeat units of polyphenylsulfone, polysulfone, polyethersulfone, and polyetherethersulfone are listed below:

(I) polysulfone (II) polyphenylsulfone (III) polyethersulfone, and (IV) polyetherethersulfone.

Preparation of polyarylethersulfones is described in U.S. Pat. Nos. 4,108,837; 4,175,175; and Canadian Patent No. 847,963 which are incorporated herein by reference in their entireties. Polysulfone is commercially available as UDEL® polysulfone from Solvay Advanced Polymers, L.L.C. Polyethersulfone and polyphenylsulfone are commercially available as RADEL® A and RADEL® R, respectively, from Solvay Advanced Polymers, L.L.C.

Other aromatic polycondensation polymers included in the polymer compositions within the scope of this invention include: polyamideimides, liquid crystalline polymers, polyimides, polyetherimides, polyaryletherketones, and polyphenylene sulfides. An example (9)

(10)

(11)

(12)

(13)

(14)

-continued

In certain embodiments of the present invention, the aromatic polycondensation polymer may preferably comprise polysulfone, polyphenylsulfone, polyethersulfone, of a polyaryletherketone included within the scope of this invention is polyetheretherketone (PEEK). PEEK comprises polymers formed the following structural unit:

PEEK is commercially available as VICTREX® from Victrex, LTD. ULTEM® polyetherimide is commercially available from General Electric. Liquid crystalline polymers and polyamideimide are available from Solvay Advanced Polymers, LLC, as XYDAR® and TORLON®, respectively.

In certain embodiments of the present invention, the polycondensation polymer has a HDT of above 100° C. under a load of 1.82 MPa when measured according to ASTM D648. In certain other embodiments of the present invention, the polycondensation polymer has a HDT of above 110° C. under a load of 1.82 MPa when measured according to ASTM D648. In certain other embodiments of the present invention, the polycondensation polymer has a heat deflection temperature HDT of below 250° C. under a load of 1.82 MPa when measured according to ASTM D648. In certain other embodiments of the present invention, the polycondensation polymer has a heat deflection temperature HDT of below 200° C. under a load of 1.82 MPa when measured according to ASTM D648. In certain other embodiments of the present invention, the polycondensation polymer has a heat deflection temperature HDT of below 170° C. under a load of 1.82 MPa when measured according to ASTM D648. In certain other embodiments of the present invention, the polycondensation polymer has a heat deflection temperature HDT of below 155° C. under a load of 1.82 MPa when measured according to ASTM D648.

Polymers usually having an HDT of at most 80° C. under a load of 1.82 MPa when measured according to ASTM D648, include polyamide 6, polyamide 66, polyamide 12, polyethylene terephthalate, and polybutylene terephthalate.

In certain embodiments of the present invention, the amount of polymer having an HDT of at most 80° C. under a load of 1.82 MPa when measured according to ASTM D648 in the polymer composition is at most 2.5 weight %, based on the total weight of the polymer composition. In certain other embodiments of the present invention, the polymer composition is substantially free of polymer having an HDT of at most 80° C. under a load of 1.82 MPa when measured according to ASTM D648.

In certain embodiments of the present invention, the polymer composition is free of polycarbonate.

Suitable white pigments for certain embodiments of the present invention include titanium dioxide, zinc sulfide, zinc oxide, barium sulfate, and potassium titanate, and mixtures thereof. In certain embodiments of the present invention, the white pigment is present in the polymer composition in a concentration of at least about 12 weight %. In certain other embodiments of the present invention, the white pigment is present in a concentration of from at least about 4 weight %. In certain other embodiments of the present invention, the white pigment is present in a concentration of up to about 30 weight %. In certain other embodiments of the present invention, the white pigment is present in a concentration of up to about 25 weight %. The concentration of white pigment is based on the total weight of the polymer composition. In certain embodiments of the present invention, the white pigment is titanium dioxide.

A suitable zinc oxide is KADOX® 911, available from Zinc Corporation of America. Suitable titanium dioxide for the present invention include rutile titania, such as Kronos 2230.

In certain embodiments of the present invention, the black pigment is present in the polymer composition in a concentration of at least about 0.0001 weight %. In certain other embodiments of the present invention, the black pigment is present in a concentration of at least about 0.0005 weight %. In certain other embodiments of the present invention, the black pigment is present in a concentration of at least about 0.0008 weight %. In certain other embodiments of the present invention, the black pigment is present in a concentration of up to about 0.02 weight %. In certain other embodiments of the present invention, the black pigment is present in a concentration of up to about 0.01 weight %. In certain other embodiments of the present invention, the black pigment is present in a concentration of up to 0.005 weight %. In certain other embodiments of the present invention, the black pigment is present in a concentration of up to 0.002 weight %. In certain other embodiments of the present invention, a black pigment concentration of about 0.0012 weight % is well suited. In certain other embodiments of the present invention, a concentration of about 0.0016 weight % black pigment is well suited.

Carbon blacks are suitable black pigments for certain embodiments of the present invention. Suitable carbon blacks include lamp blacks, furnace blacks, channel blacks, oil blacks, and acetylene blacks. Suitable carbon blacks for the present invention include RAVEN® carbon black, available from Columbian Chemicals Company; SHAWNIGAN BLACK®, available from Chevron Phillips Chemical Company; BLACK PEARLS®, MONARCH®, and REGAL® carbon blacks, all available from Cabot Corporation, and MPC Channel Black.

Certain embodiments of the present invention, further comprise from about 5 weight % glass fiber. Certain other embodiments of the instant invention further comprise up to about 25 weight % glass fiber. Certain embodiments of the present invention comprise from about 0.1 weight % antioxidant. Certain other embodiments of the present invention comprise up to about 2 weight % antioxidant. The weight percents are based on the total weight of the polymer composition.

Glass fibers are commercially available in continuous filament, chopped, and milled forms. Any of these forms of glass fiber can be used in the practice of this invention. A suitable glass fiber for embodiments of this invention is CERTAIN-TEED® 910 fiberglass, available from Vetrotex CertainTeed Corp. Another suitable glass fiber is fiberglass ⅛" 3/16" available from Saint Gobain. Suitable antioxidants include IRGANOX® 1098, available from Ciba Specialty Chemicals.

The compositions of the present invention, may optionally include reinforcing filler, additives, and like. Representative fibers which may serve as reinforcing media include graphitic carbon fibers, amorphous carbon fibers, synthetic polymeric fibers, aluminum fibers, aluminum silicate fibers, oxide of metals such as aluminum fibers, titanium fibers, magnesium fibers, wollastonite, rock wool fibers, steel fibers, tungsten fibers, silicon carbide fibers, alumina fibers, boron fibers, etc. Representative filler and other materials include glass, calcium silicate, silica, clays, such as kaolin, chalk, mica, talc, and other mineral fillers and other additives such as, wollastonite, graphite, alumina trihydrate, sodium aluminum carbonate, barium ferrite, etc. Suitable polymeric fibers include fibers formed from engineering polymers such as, for example, poly(benzothiazole), poly(benzimidazole), polyarylates, poly(benzoxazole), polyaryl ethers, aromatic polyamide fibers such as the fibers sold by the DuPont Company under the trade name KEVLAR®, and the like, and may include mixtures comprising two or more such fibers. The compositions of this invention may further include additional additives commonly employed in the art, such as thermal stabilizers, ultraviolet light stabilizers, oxidative stabilizers, plasticizers, lubricants, and mold release agents. Certain polymer compositions according to the present invention further comprise an external lubricant, such as PTFE or low density polyethylene (LDPE), to facilitate extrusion. Suitable powdered PTFE for certain embodiments of the present invention include POLYMIST® F5A available from Solvay Solexis. The levels of such additives will be determined for the particular use envisioned, with up to about 50 weight %, based on total composition, of such additional additives considered to be within the range of ordinary practice in the polymer compounding art.

A certain embodiment of the instant invention comprises 59.5 weight % polyphthalamide, 25 weight % titanium dioxide, 15 weight % fiberglass, 0.5 weight % antioxidant, and 0.0016 weight % carbon black.

Figure 1:
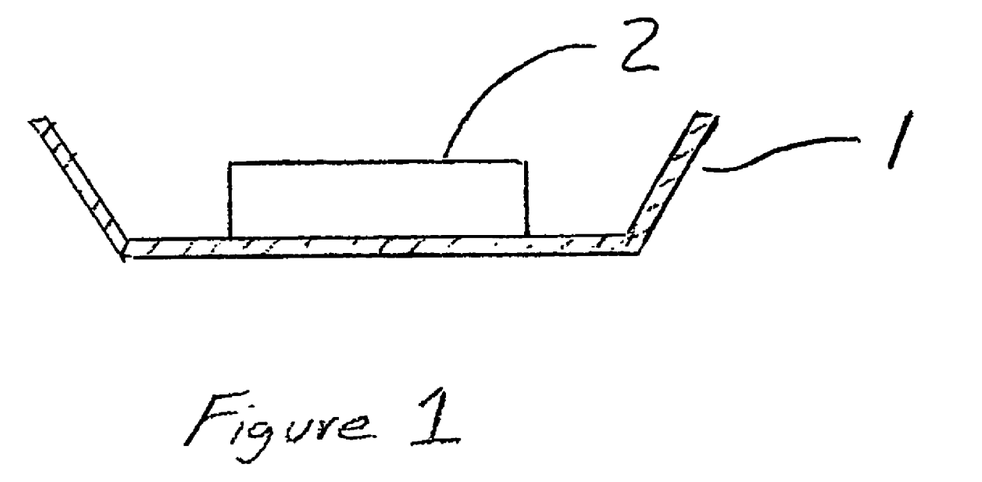
FIG. 1 schematically illustrates a LED reflector cup according to an embodiment of the instant invention.
Figure 2:
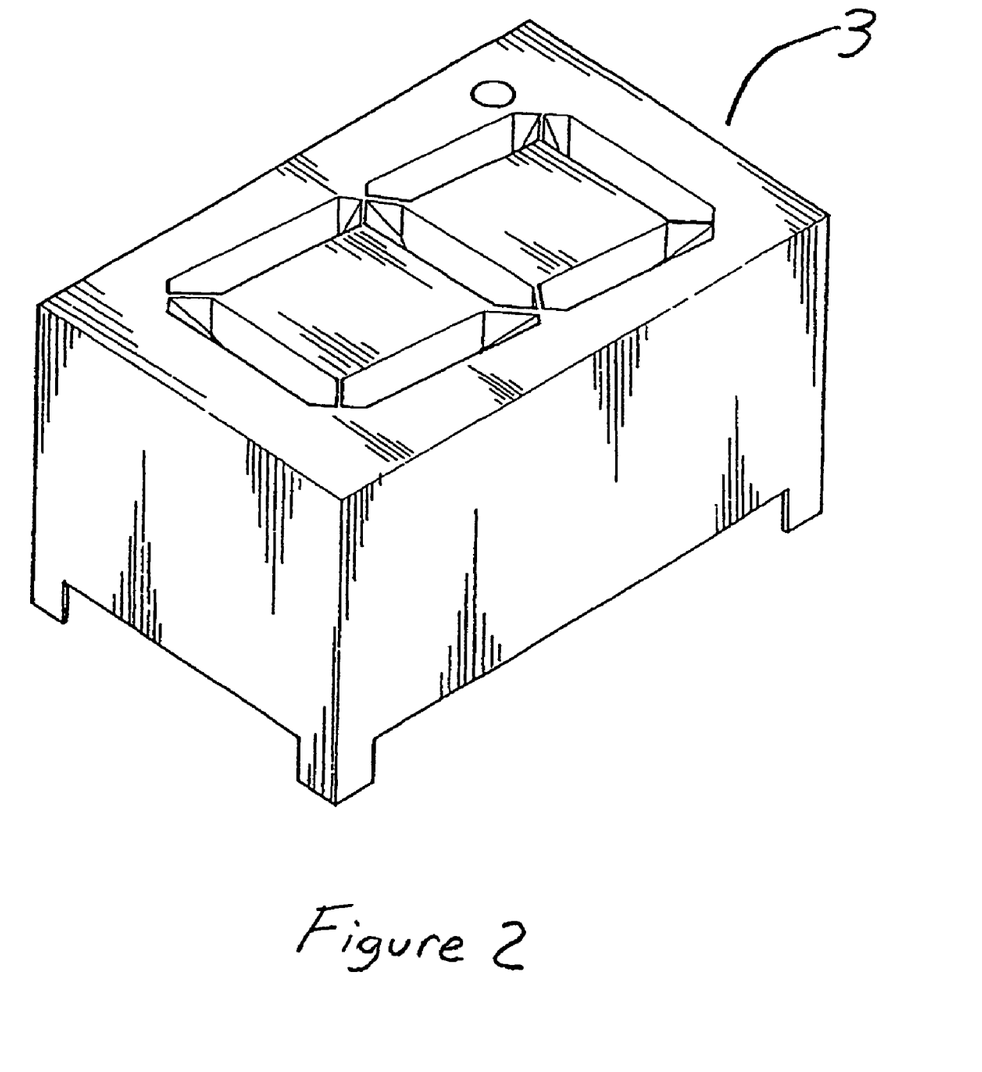
FIG. 2 illustrates a seven segment scrambler for an LED according to an embodiment of the instant invention.

Additional embodiments of the present invention include shaped articles made from any of the polymer compositions described herein. The composition of the present invention can be molded, such as by melt fabricating, injection molding, extruding, and blow molding, to form a variety of shaped articles. Articles within the scope of this invention include LED components such as reflector cups for surface mount LEDs, scramblers (coyers) for seven-segment LEDs, and reflectors for any type of LED. Such reflectors, reflector cups, and scramblers feature improved anti-yellowing properties during heat aging, and have excellent opacity and reflectivity properties. A reflector cup 1 according to the present invention is illustrated in FIG. 1, with an LED element 2 positioned inside the cup 1. The shape of reflector cup 1, can be varied to optimize light reflection. Other common shapes of reflector cups include parabaloidal, conical, and hemispherical. A seven segment scrambler 3 for an LED according to the present invention is illustrated in FIG. 2.

An additional embodiment of the present invention is the use of a black pigment to improve the heat stability of a white-pigmented polycondensation polymer composition. The polymer composition comprises at least 20 weight % of at least one polycondensation polymer having a heat deflection temperature of above 80° C. under a load of 1.82 MPa when measured according to ASTM D648, and from 0 to 5 weight % of at least one polymer having a heat deflection temperature of at most 80° C. under a load of 1.82 Mpa when measured according to ASTM D648.

Another additional embodiment of the present invention is a polymer composition comprising at least 20 weight % of at least one polycondensation polymer having a heat deflection temperature of above 80° C. under a load of 1.82 MPa when measured according to ASTM D648. The composition further comprises from 0 to 5 weight % of at least one polymer having a heat deflection temperature of at most 80° C. under a load of 1.82 MPa when measured according to ASTM D648, and a white pigment After 3 hours of heat aging at 170° C. the polymer composition has a reflectivity of greater than 65% at a wavelength of 420 nm.

The invention will be further described by examples. The examples are illustrative of the present invention and do not limit the scope of the claimed invention.

EXAMPLES

Example 1

44.625 pounds of an AMODEL® polyphthalamide comprising, as the dicarboxylic acid component, about 65 mole % terephthalic acid and 35 mole % adipic acid, and, as the diamine component, about 100 mole % hexamethylene diamine, having a HDT measured according to ASTM D648 under a load of 1.82 MPa of 120° C., was blended with 11.25 pounds of Saint Gobain fiberglass ⅛" 3/16", 18.75 pounds Kronos® 2230 titanium dioxide, 0.0012 pounds MPC channel black, and 0.375 pounds of IRGANOX® 1098 to form a polyphthalamide composition with excellent anti-yellowing, opacity, and reflectivity properties.

The properties of the polymer composition of Example 1 are listed in Table 2.

TABLE 2

Example 1 Properties

| TEST | VALUES |
| --- | --- |
| Tensile Strength (psi) | 13,850 |
| Tensile Elongation (%) | 1.2 |
| Tensile Modulus (kpsi) | 1260 |
| Flex Strength (psi) | 24,820 |
| Flex Strain (%) | 2.39 |
| Flex Modulus (kpsi) | 1094 |
| Notched Izod (ft-lb/in) | 0.46 |
| HDT @ 1.82 MPa (264 psi) (° C.) | 290.6 |
| Ash (%) | 40.24 |
| Pellet IV (dl/gr) | 0.98 |
| Moisture (ppm) | 570 |
| Pellet Density (kg/m$^3$) | 1.56 |

Table 3 lists the carbon black content of Control C1 and Examples 2, 3, and 4. MPC Channel Black was used in each of the Examples. The carbon black was added to 75 pounds of polyphthalamide composition. The compositions C1, 2, 3, and 4 are substantially similar to Example 1, except the amount of carbon black in each composition is different from each other, as shown in Table 3.

TABLE 3

Carbon black content of polyphthalamide compositions.

| | Examples | | | |
|---|---|---|---|---|
| | C1 | 2 | 3 | 4 |
| Carbon Black Content (%) | 0 | 0.0012 | 0.0009 | 0.0016 |

Figure 3:
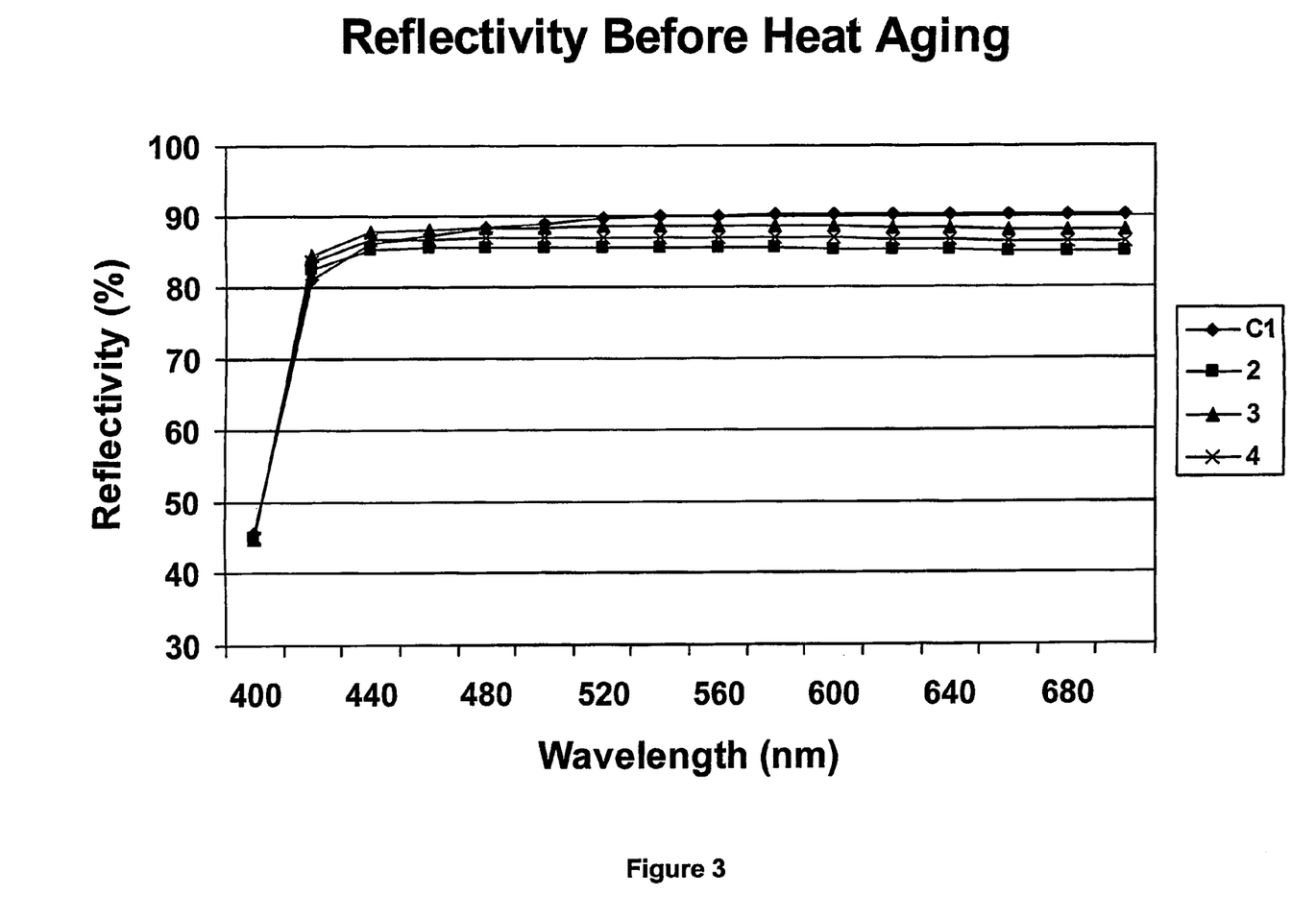
FIG. 3 is a plot of reflectivity versus wavelength for polycondensation polymer compositions according to embodiments of the present invention.
Figure 4:
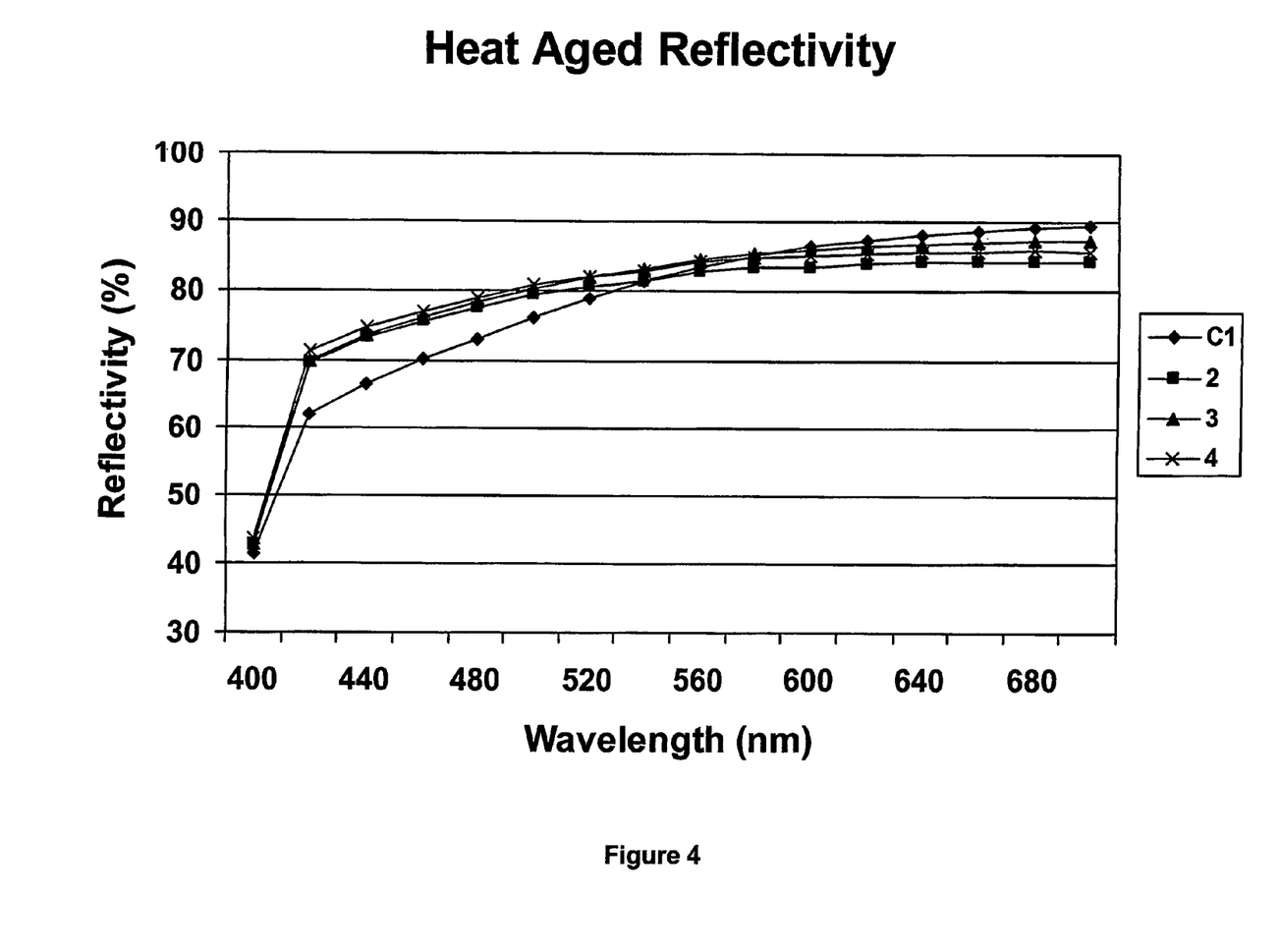
FIG. 4 is a plot of heat aged reflectivity versus wavelength of light for polycondensation polymer compositions according to embodiments of the present invention.

The reflectivity data of the molded compositions according to the instant invention before and after heat aging are listed in Tables 4 and 5, and plotted in FIGS. 3 and 4. Heat aging is performed for three hours at 170° C. in a forced air oven at ambient humidity. Reflectivity of plaques formed from the polymer compositions is measured using a calorimeter. Light from a xenon arc source impinge on the plaques at an oblique angle and light reflected from the surface of the plaque is collected by the colorimeter through an adjustable wavelength filter. Thus, reflectivity is measured at a number of different wavelengths. The reflectance of the plaques is compared to the reflectance of a known standard. The decreased reflectivity of the compositions after heat-aging is a result of the yellowing of the composition. As shown in FIG. 4, after heat aging, the compositions of the present invention, have improved reflectivity in the shorter visible wavelengths (blue end of visible spectrum), hence there is less yellowing than the control composition.

TABLE 4

Reflectivity Before Heat Aging

| Wavelength | Reflectivity (%) Examples | | | |
|---|---|---|---|---|
| (nm) | C1 | 2 | 3 | 4 |
| 400 | 46 | 45 | 45 | 45 |
| 420 | 81 | 82 | 84 | 84 |
| 440 | 86 | 85 | 88 | 87 |
| 460 | 87 | 85 | 88 | 87 |
| 480 | 88 | 85 | 88 | 87 |
| 500 | 89 | 86 | 88 | 87 |
| 520 | 90 | 86 | 88 | 87 |
| 540 | 90 | 86 | 89 | 87 |
| 560 | 90 | 86 | 88 | 87 |
| 580 | 90 | 85 | 88 | 87 |
| 600 | 90 | 85 | 88 | 87 |
| 620 | 90 | 85 | 88 | 87 |
| 640 | 90 | 85 | 88 | 87 |
| 660 | 90 | 85 | 88 | 86 |
| 680 | 90 | 85 | 88 | 86 |
| 700 | 90 | 85 | 88 | 86 |

TABLE 5

Heat Aged Reflectivity

| Wavelength | Reflectivity (%) Examples | | | |
|---|---|---|---|---|
| (nm) | C1 | 2 | 3 | 4 |
| 400 | 41 | 43 | 43 | 44 |
| 420 | 62 | 70 | 70 | 71 |
| 440 | 67 | 73 | 74 | 75 |
| 460 | 70 | 76 | 76 | 77 |
| 480 | 73 | 77 | 78 | 79 |
| 500 | 76 | 79 | 80 | 81 |
| 520 | 79 | 80 | 82 | 82 |
| 540 | 81 | 81 | 83 | 83 |
| 560 | 84 | 83 | 85 | 84 |
| 580 | 85 | 83 | 85 | 85 |
| 600 | 86 | 83 | 86 | 85 |
| 620 | 87 | 84 | 86 | 85 |
| 640 | 88 | 84 | 87 | 86 |
| 660 | 89 | 84 | 87 | 86 |
| 680 | 89 | 84 | 87 | 86 |
| 700 | 89 | 84 | 87 | 86 |

The embodiments illustrated in the instant disclosure are for illustrative purposes. They should not be construed to limit the scope of the claims. As is clear to one of ordinary skill in this art, the instant disclosure encompasses a wide variety of embodiments not specifically illustrated herein.

What is claimed is:

1. A polymer composition comprising:
   at least 20 weight %, based on the total weight of the polymer composition, of at least one polycondensation polymer having a heat deflection temperature of above 80° C. under a load of 1.82 MPa when measured according to ASTM D648;
   from 0 to 5 weight %, based on the total weight of the polymer composition, of at least one polymer having a heat deflection temperature of at most 80° C. under a load of 1.82 MPa when measured according to ASTM D648;
   a white pigment present in a concentration of at least 4 weight %, based on the total weight of the composition; and
   a black pigment present in a concentration of at least 0.0001 weight % and up to 0.002 weight %, based on the total weight of the composition,
   wherein the polycondensation polymer is selected from the group consisting of at least partially aromatic polyamides, polyamideimides, liquid crystalline polymers, polyimides, polyetherimides, polyaryletherketones, polyarylethersulfones, and polyphenylene sulfides.

2. The polymer composition according to claim 1, wherein the polycondensation polymer is selected from the group consisting of a polyamideimide, a polyimide and a polyetherimide.

3. The polymer composition according to claim 1, wherein the polycondensation polymer is selected from the group consisting of a liquid crystalline polymer, a polyaryletherketone and a polyphenylene sulfide.

4. The polymer composition according to claim 1, wherein the white pigment is titanium dioxide.

5. The polymer composition according to claim 4, wherein the black pigment is a carbon black.

6. The polymer composition according to claim 1, wherein the black pigment is a carbon black.

7. The polymer composition according to claim 1, wherein the polycondensation polymer is present in a concentration of at least 40 weight %, based on the total weight of the composition.

8. The polymer composition according to claim 1, wherein the white pigment is present in a concentration of at least 12 weight %, based on the total weight of the composition.

9. Shaped article formed from the composition according to claim 1.

10. The shaped article according to claim 9, wherein it is selected from the group consisting of a reflector for an LED, a reflector cup for a surface mount LED, and a scrambler for a seven-segment LED.

11. The polymer composition according to claim 1, comprising said at least one polymer having a heat deflection temperature of at most 80° C. under a load of 1.82 MPa when measured according to ASTM D648.

12. The polymer composition according to claim 1, wherein the polymer composition is substantially free of polymer having a heat deflection temperature of 80° C. or lower under a load of 1.82 MPa when measured according to ASTM D648.

13. A method for improving the heat stability of a white-pigmented polycondensation polymer composition in need thereof, said polymer composition comprising at least 20 weight % of at least one polycondensation polymer having a heat deflection temperature of above 80° C. under a load of 1.82 MPa when measured according to ASTM D648, at least 4 weight % white pigment, based on the total weight of the polymer composition, and from 0 to 5 weight % of at least one polymer having a heat deflection temperature of at most 80° C. under a load of 1.82 MPa when measured according to ASTM D648, said method comprising adding a black pigment to said white-pigmented polycondensation polymer composition in an amount of at least 0.0001 weight % and up to 0.002 weight %, based on the total weight of the polymer composition, wherein the polycondensation polymer is selected from the group consisting of polyarylethersulfones, at least partially aromatic polyamides, polyamideimides, liquid crystalline polymers, polyimides, polyetherimides, polyaryletherketones, and polyphenylene sulfides.

14. The method according to claim 13, wherein the polycondensation polymer is selected from the group consisting of polyarylethersulfones and at least partially aromatic polyamides.

15. A polymer composition comprising:
    at least 20 weight %, based on the total weight of the polymer composition, of at least one at least partially aromatic polyamide having a heat deflection temperature of above 80° C. under a load of 1.82 MPa when measured according to ASTM D648;
    from 0 to 5 weight %, based on the total weight of the polymer composition, of at least one polymer having a heat deflection temperature of at most 80° C. under a load of 1.82 MPa when measured according to ASTM D648;
    a white pigment present in a concentration of at least 4 weight %, based on the total weight of the composition; and
    a black pigment present in a concentration of at least 0.0001 weight % and up to 0.002 weight %, based on the total weight of the composition.

16. The polymer composition according to claim 15, wherein the at least partially aromatic polyamide is a polyphthalamide formed from terephthalic acid and an aliphatic diamine, and optionally, in addition, isophthalic acid and/or an aliphatic dicarboxylic acid.

17. The polymer composition according to claim 15, wherein the at least partially aromatic polyamide is formed from an aliphatic dicarboxylic acid and an aromatic diamine.

18. The polymer composition according to claim 15, wherein the white pigment is titanium dioxide.

19. The polymer composition according to claim 18, wherein the black pigment is a carbon black.

20. The polymer composition according to claim 15, wherein the black pigment is a carbon black.

21. The polymer composition according to claim 15, wherein the polycondensation polymer is present in a concentration of at least 40 weight %, based on the total weight of the composition.

22. The polymer composition according to claim 15, wherein the white pigment is present in a concentration of at least 12 weight %, based on the total weight of the composition.

23. Shaped article formed from the composition according to claim 15.

24. The shaped article according to claim 23, wherein it is selected from the group consisting of a reflector for an LED, a reflector cup for a surface mount LED, and a scrambler for a seven-segment LED.

25. The polymer composition according to claim 15, comprising said at least one polymer having a heat deflection temperature of at most 80° C. under a load of 1.82 MPa when measured according to ASTM D648.

26. The polymer composition according to claim 15, wherein the white pigment is titanium dioxide present in a concentration of at least 12 weight %, based on the total weight of the composition, and wherein the black pigment is a carbon black.

27. The polymer composition according to claim 15, wherein the polymer composition is substantially free of polymer having a heat deflection temperature of 80° C. or lower under a load of 1.82 MPa when measured according to ASTM D648.

28. A polymer composition comprising:
    at least 20 weight %, based on the total weight of the polymer composition, of at least one polyarylethersulfone having a heat deflection temperature of above 80° C. under a load of 1.82 MPa when measured according to ASTM D648;
    from 0 to 5 weight %, based on the total weight of the polymer composition, of at least one polymer having a heat deflection temperature of at most 80° C. under a load of 1.82 MPa when measured according to ASTM D648;
    a white pigment present in a concentration of at least 4 weight %, based on the total weight of the composition; and
    a black pigment present in a concentration of at least 0.0001 weight % and up to 0.002 weight %, based on the total weight of the composition.

29. The polymer composition according to claim 28, wherein the polycondensation polymer is a polysulfone.

30. The polymer composition according to claim 28, wherein the polycondensation polymer is a polyphenylsulfone.

31. The polymer composition according to claim 28, wherein the polycondensation polymer is a polyethersulfone.

32. The polymer composition according to claim 28, wherein the polycondensation polymer is polyethersulfone, the white pigment is titanium dioxide and the black pigment is a carbon black.

33. The polymer composition according to claim 28, wherein the white pigment is titanium dioxide and wherein the black pigment is a carbon black.

34. The polymer composition according to claim 28, wherein the white pigment is titanium dioxide.

35. The polymer composition according to claim 28, wherein the black pigment is a carbon black.

36. The polymer composition according to claim 28, wherein the polycondensation polymer is present in a concentration of at least 40 weight %, based on the total weight of the composition.

37. The polymer composition according to claim 28, wherein the white pigment is present in a concentration of at least 12 weight %, based on the total weight of the composition.

38. Shaped article formed from the composition according to claim 28.

39. The shaped article according to claim 38, wherein it is selected from the group consisting of a reflector for an LED, a reflector cup for a surface mount LED, and a scrambler for a seven-segment LED.

40. The shaped article according to claim 38, wherein the polycondensation polymer is polyethersulfone, the white pigment is titanium dioxide and the black pigment is a carbon black.

41. The polymer composition according to claim 28, comprising said at least one polymer having a heat deflection temperature of at most 80° C. under a load of 1.82 MPa when measured according to ASTM D648.

42. The polymer composition according to claim 28, wherein the polymer composition is substantially free of polymer having a heat deflection temperature of 80° C. or lower under a load of 1.82 MPa when measured according to ASTM D648.

* * * * *

UNITED STATES PATENT AND TRADEMARK OFFICE
CERTIFICATE OF CORRECTION

| | | |
|---|---|---|
| PATENT NO. | : 7,709,568 B2 | Page 1 of 1 |
| APPLICATION NO. | : 10/531251 | |
| DATED | : May 4, 2010 | |
| INVENTOR(S) | : Bruce H Bersted et al. | |

It is certified that error appears in the above-identified patent and that said Letters Patent is hereby corrected as shown below:

Col. 16, claims 18 line 1 and 34 line 1, should read, --The polymer composition according to claim 15, wherein the white pigment is titanium dioxide.--

Col. 16, claims 21 line 1 and 36 line 1, should read, --The polymer composition according to claim 15, wherein the polycondensation polymer is present in a concentration of at least 40 weight %, based on the total weight of the composition.--

Col. 16, claims 22 line 1 and 37 line 1, should read, --The polymer composition according to claim 15, wherein the white pigment is present in a concentration of at least 12 weight %, based on the total weight of the composition.--

Col. 16, claims 23 line 1 and Col. 17, 38 line 1, should read, --Shaped article formed from the composition according to claim 15.--

Col. 16, claims 24 line 1 and Col. 17, 39 line 1, should read, --The shaped article according to claim 23, wherein it is selected from the group consisting of a reflector for an LED, a reflector cup for a surface mount LED, and a scrambler for a seven-segment LED.--

Signed and Sealed this

Twenty-fourth Day of August, 2010

David J. Kappos
*Director of the United States Patent and Trademark Office*